United States Patent [19]

Jabs

[11] Patent Number: 4,686,478

[45] Date of Patent: Aug. 11, 1987

[54] TESTING DEVICE FOR DETECTING CONTACT CHATTER IN ELECTRICAL COMPONENTS WITH MOVABLE CONTACTS, SUCH AS RELAYS

[75] Inventor: Robert H. Jabs, Greensburg, Pa.

[73] Assignee: Westinghouse Electric Corp., Pittsburgh, Pa.

[21] Appl. No.: 741,424

[22] Filed: Jun. 5, 1985

[51] Int. Cl.[4] .................... G01R 31/12; G01R 31/02; G08B 21/00
[52] U.S. Cl. .................................. 324/420; 340/644
[58] Field of Search ............... 324/418, 419, 420, 422, 324/423; 340/644; 335/104, 193

[56] References Cited

U.S. PATENT DOCUMENTS 3,355,660  11/1967  Drazic .
3,364,419  1/1968   Anderson .
3,648,233  3/1972   Clark .
3,872,473  3/1975   Melgaard et al. .
3,993,949  11/1976  Magno et al. .
4,173,735  11/1979  Merchant .

FOREIGN PATENT DOCUMENTS 395919  1/1974  U.S.S.R. .
983656  2/1983  U.S.S.R. .

OTHER PUBLICATIONS

West, "Contact Bounce Tester", IBM Technical Disclosure Bulletin, vol. 20, No. 3, 1977, pp. 1081-1082.

Primary Examiner—Reinhard J. Eisenzopf
Assistant Examiner—Walter E. Snow
Attorney, Agent, or Firm—Daniel C. Abeles

[57] ABSTRACT

A contact chatter detector includes a bipolar power supply and a switching system which permits the fixed contacts of a relay under test to be connected either to the positive or the negative terminal of the power supply, the movable contacts of the relay under test being grounded. Depending upon the switch position and whether or not chatter is present, the fixed contacts may be at ground potential, a positive potential, or a negative potential. Binary gates continuously monitor the fixed contacts, and are able to accommodate the three input states by receiving power from power supply translation circuits which effectively adjust the gates to be responsive to the negative potential and ground at one switch position and to ground and the positive potential at another switch position. Interruption alarms connected to the gates determine whether chatter exceeds a predetermined minimum, regardless of the rate at which the chatter pulses occur. The contact chatter detector can easily be expanded to permit testing of more than one relay simultaneously.

20 Claims, 7 Drawing Figures

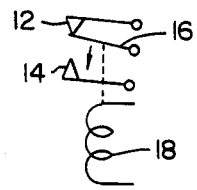
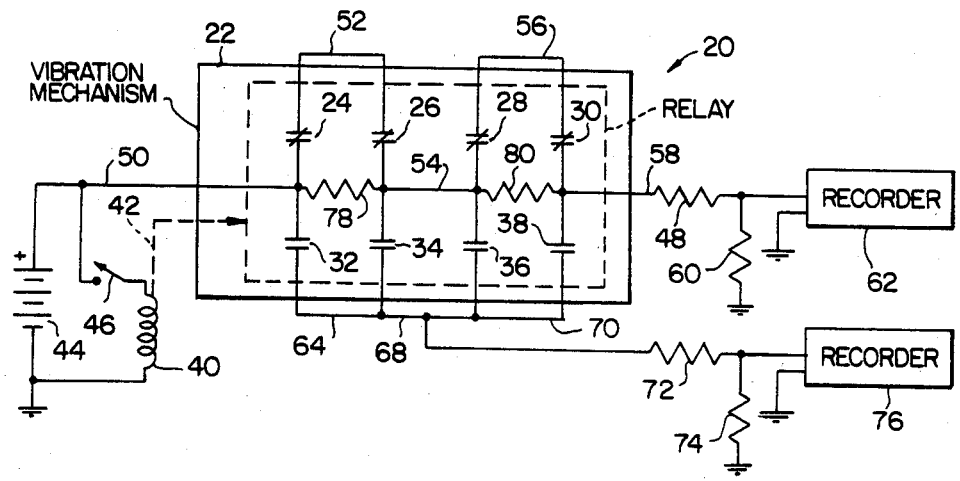
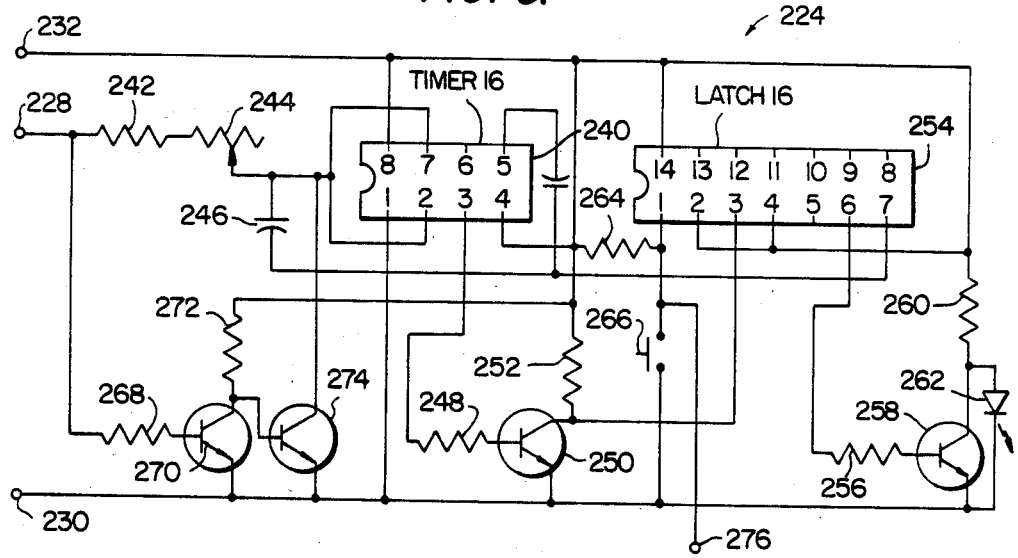

TESTING DEVICE FOR DETECTING CONTACT CHATTER IN ELECTRICAL COMPONENTS WITH MOVABLE CONTACTS, SUCH AS RELAYS

BACKGROUND OF THE INVENTION

The present application is directed to a contact chatter detector for use during seismic or vibration testing of electrical devices having contacts, and more particularly to a testing device which monitors the contacts of one or more relays regardless of the state of the relays (i.e., energized, non-energized, or transition) and which detects contact chatter having a duration greater than a predetermined minimim.

Many mechanical switching-type devices employ metal contacts which move toward or away from each other to close or open circuits, respectively. The switching performance of such devices, particularly as they age, may deteriorate and result in contact chatter when the devices are subjected to mechanical forces such as vibration. Relays are among the mechanical-type switching devices that are vibration sensitive. A single-pole, double-throw relay, for example, is illustrated in FIG. 1A and includes two fixed contacts 12 and 14 that are spaced apart by a gap. A movable contact 16 is disposed in the gap and is spring-biased toward contact 12. This is deemed the "normally closed" contact. The relay also includes a solenoid 18 which, when energized, pulls movable contact 16 from contact 12 to contact 14, the "normally open" contact. Vibration may momentarily jolt movable contact 16 away from normally closed contact 12 when solenoid 18 is in the de-energized state or, similarly, may momentarily jolt movable contact 16 away from normally open contact 14 when solenoid 18 is in the energized state. Moreover, during the transition state, as movable contact 16 snaps from one fixed contact to the other, vibration exacerbates the "contact bounce" phenomenon as movable contact 16 hits a fixed contact and rebounds from it. The same problems, of course, occur in double-pole, triple-pole, etc. relays, which have more than one pair of fixed contacts and more than one movable contact.

In practice relays are frequently fabricated and shipped in lots with the characteristics of the relays being fairly uniform within a lot. Accordingly, a representative sample of the relays in a lot, such as three randomly selected relays, may be tested in order to evaluate the entire lot. For example IEEE 501-1978 "IEEE Standard, Seismic Testing of Relays" provides that relays must be tested while in the energized mode, the de-energized mode, and the transition mode, and that a minimum of three relays must be tested for each mode. The standard requires that all relay contacts are to be continuously monitored for contact chatter during the test, and that chatter of two milliseconds or more must be detectable. Furthermore the standard specifies that 125 VDC must be applied to all contacts. This latter requirement serves to ensure that contact chatter is not missed due to oxidized contacts.

With these testing criteria in mind one might seek to employ the circuit of FIG. 1B to test 4PDT (four pole, double throw) relay 20, which is mounted on vibration mechanism 22. Relay 20 includes normally closed contacts 24, 26, 28, and 30, and normally open contacts 32, 34, 36 and 38. Relay 20 also includes solenoid 40, which is mechanically coupled to the four movable contacts as indicated by dotted arrow 42. It will be apparent that the movable contacts are not specifically illustrated in the schematic diagram of relay 20 but are, instead, present conceptually as parts of the normally closed and normally open contacts. For example normally closed contact 24 represents a fixed contact which touches a movable contact when solenoid 40 is de-energized, while normally open contact 32 represents the adjacent fixed contact to which the movable contact moves when solenoid 40 is energized.

The negative terminal of 125 volt battery 44 is connected to ground and one lead of solenoid 40. The other lead of solenoid 40 is connected to the positive terminal of battery 44 through switch 46. Normally closed contacts 24-30 are connected sequentially between battery 44 and resistor 48 by wires 50, 52, 54, 56, and 58. Resistor 60 and chart recorder 62 are connected parallel to one another between resistor 48 and ground. Normally open contacts 32-38 are connected together by wires 64, 68, and 70, which are connected through resistor 72 to resistor 74 and chart recorder 76. The reason for resistors 78 and 80 will be explained momentarily.

With continuing reference to FIG. 1B, during a test of the de-energized mode switch 46 is open as illustrated and vibration mechanism 22 is activated for perhaps 20 seconds, the mechanism exerting a maximum force of perhaps 44 spectrum gravities on the movable contacts. If all of the normally closed contacts 24-30 remain closed, the full voltage of battery 44 is applied across resistors 48 and 60, resulting in a uniform line produced by recorder 62. Should one or more of contacts 24-30 open momentarily, however, additional resistance (78 or 80 or both) would be inserted into the circuit, so that the signal detected by recorder 62 would drop momentarily. Similarly, during the test the signal received by recorder 76 would be zero unless one or more of normally open contacts 32-38 closes momentarily.

Resistors 78 and 80 might be omitted except for an anomalous situation which would result if contacts 24 and 30 were to bounce open, with the movable contact associated with contact 30 going further and closing contact 38. The closure of contact 38 would not be detected by recorder 76 were resistors 78 and 80 replaced by insulators. Although the closure of contact 38 in this situation may seem unlikely, the response of aged relays during seismic stresses is not well researched, so that all volt combinations should be tested.

With continuing reference to FIG. 1B, relay 20 is energized by closing switch 46, whereupon normally closed contacts 24-30 are opened and normally open contacts 32-38 are closed. In order to connect the now-closed contacts 32-38 in series between resistor 48 and battery 44, however, wire 68 would have to be removed. Furthermore a wire joining wires 52 and 56 would be needed to connect the now-opened contacts 24-30 in parallel for sensing by recorder 76. The transition mode is tested, in accordance with IEEE 501-1978, by activating switch 46 while relay 20 is wired for testing in the energized mode; bouncing is detected if recorders 62 and 76 achieve their expected readings for the energized mode after switch 46 is closed and thereafter deviate from these expected readings.

The circuit of FIG. 1B has several shortcomings. If only three relays from each lot are to be devoted to testing, separate tests and the attendant wiring changes are needed to account for all three relay operating modes. Furthermore the records produced by chart recorders 62 and 76 must be inspected to determine whether the duration of a pulse exceeds a predetermined minimum, such as 2 milliseconds. The inspection problem is complicated because commercially available chart recorders typically have limited response to short duration pulses.

SUMMARY OF THE INVENTION

Accordingly, an object of the present invention is to provide a circuit which automates and greatly simplifies the seismic testing of electrical devices having contacts, such as relays, switches, voltage breakers, etc.

Another object of the present invention is to provide a contact chatter detector which tests all three relay operating modes without wiring changes, with an automatic resetting feature being provided for use during the transition mode test.

Another object of the present invention is to provide a contact chatter detector which detects whether a pulse arising from signal interruption exceeds a predetermined duration, even if the pulses follow one another rapidly.

These and other objects are achieved by providing a contact chatter detector having a bipolar power supply which selectively supplies positive or negative test voltages for the contacts being tested. The contacts are monitored by gate circuits, the operating ranges of which are set by power supply translation circuits in accordance with the polarity of the voltage supplied to the monitored contacts. Interruption alarms are responsive to the outputs of the gates and detect whether contact interruption of a predetermined duration has occurred. Each interruption alarm includes a timer circuit which is connected to a resistor and capacitor to set the delay, the capacitor being discharged after each pulse in order to permit accurate timing of rapidly occurring pulses. If the timer circuit is triggered, it sets a latch which in turn illuminates an LED to indicate that chatter has occurred. The latch can be manually reset or automatically reset when the state of the relay under test is changed. The contact chatter detector of the invention can readily be expanded to simultaneously test a plurality of relays.

BRIEF DESCRIPTION OF THE DRAWINGS

FIG. 1A schematically illustrates an SPDT relay;

FIG. 1B is a schematic block diagram of a contact chatter detector having shortcomings which are overcome by the present invention;

FIG. 3 is a schematic block diagram of an interruption alarm in FIG. 2;

DESCRIPTION OF THE PREFERRED EMBODIMENTS

Figure 2:
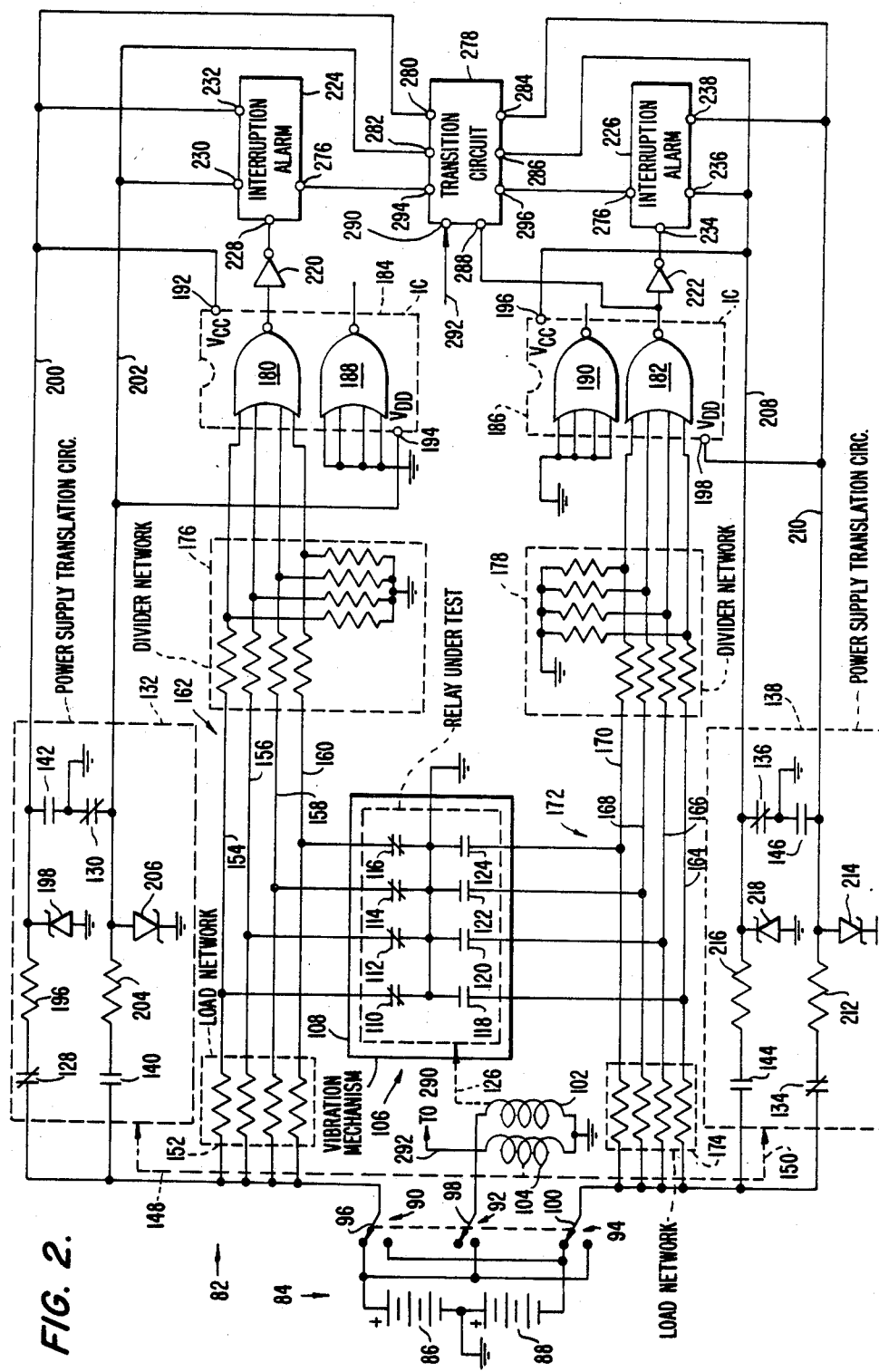
FIG. 2 is a schematic diagram of the contact chatter detector of the present invention.

Contact chatter detector 82 of the present invention is illustrated in FIG. 2, and includes bipolar power supply 84 having a first voltage source in the form of 125 volt DC supply 86 and a second voltage source in the form of 125 volt DC supply 88, DC supplies 86 and 88 being series-connected and grounded at the connection point. Switches 90, 92, and 94 are mechanically connected or "ganged" so that their movable contacts 96, 98, and 100, respectively, move together. In the "up" position of switches 90-94, contact 96 is connected to the plus terminal of DC supply 86, contact 100 is connected to the minus terminal of DC supply 88, and contact 92 is floating. In the "down" position of switches 90-94, contact 96 is connected to the minus terminal of DC supply 88 and contacts 98 and 100 are connected to the plus terminal of DC supply 86. Accordingly it will be apparent that in the "up" position contact 96 is positive with respect to ground and contact 100 is negative with respect to ground, and that these potentials are reversed when switches 90-94 are moved to the "down" position. On the other hand contact 98 is connected to neither DC supply except when switches 90-94 are in the "down" position.

Solenoids 102 and 104 are connected in parallel between contact 98 and ground, so that they are energized only when switches 90-94 are in the "down" position. Solenoid 102 is part of 4PDT relay under test 106, which is mounted on vibration mechanism 108. Relay 106 includes normally closed contacts 110, 112, 114, and 116, and normally open contacts 118, 120, 122, and 124. Physically, contacts 110 and 118, for example, represent a group which includes a pair of fixed contacts that are spaced apart by a gap, with a movable contact disposed between. The movable contact is biased so that it rests against one of the fixed contacts to provide normally closed contact 110 when solenoid 102 is not energized. Solenoid 102 is magnetically coupled to the movable contacts of relay 106, as indicated by dotted line 126, so that the normally closed contacts 110-116 open and normally open contacts 118-124 close when solenoid 102 is energized. Solenoid 104 is part of an additional 4PDT relay (not numbered) having normally closed contacts 128 and 130 in power supply translation circuit 132 and normally closed contacts 134 and 136 in power supply translation circuit 138. The additional relay also has normally open contacts 140 and 142 in circuit 132 and normally open contacts 144 and 146 in circuit 138. In FIG. 2 dotted arrows 148 and 150 are used to indicate that the contacts in circuits 132 and 138 are magnetically coupled to solenoid 104.

With continuing reference to FIG. 2, load network 152 consists of resistors which connect conductors 154, 156, 158, and 160 of bus 162 to contact 96 of switch 90. Similarly, conductors 164, 166, 168, and 170 of bus 172 are connected to contact 100 of switch 94 through the resistors of load network 174. The conductors of bus 162 are connected to ground via normally closed contacts 110-116 and, similarly, the conductors of bus 172 are connected to ground via normally open contacts 118-124 (physically, the movable contacts between the fixed contacts are all grounded). The resistors of networks 152 and 174 have relatively low ohmage values (e.g., 2 kilohms) and serve to limit current through contacts 110-124. On the other hand the values of the resistors in voltage divider networks 176 and 178, which are connected to buses 162 and 172 respectively, are relatively high (for example, 100 kilohms for the horizontally disposed resistors in FIG. 2 and 10 kilohms for the vertically disposed resistors) to provide an attenuated voltage for input to the NOR gates. Accordingly, it will be apparent that when switches 90-94 are in the "up" position as illustrated in FIG. 2 and when contacts 110–116 are truly closed and contacts 118–124 are truly open, the conductors of bus 162 will be at ground potential and the conductors of bus 172 will be almost 125 volts (the voltage of DC supply 88) below ground. However should normally closed contact 110, for example, momentarily open while switches 90–94 are in the up position, the potential on conductor 154 would be raised to almost 125 volts (the voltage of DC supply 86) during this period. This voltage would be dropped to about 10 volts by network 176 before being applied to the respective input of NAND gate 180. Similarly should normally open contact 118, for example, momentarily close while switches 90–94 are in the "up" position, the potential on conductor 164 would rise from about minus 125 volts to ground. Network 178 would reduce the minus 125 volts to about minus 10 volts for application to the respective input of NAND gate 182.

When switches 90–94 are moved to the "down" position, normally closed contacts 110–116 are opened and normally open contacts 118–124 are closed. The potential on the conductors of bus 162 is approximately minus 125 volts (the voltage of DC supply 88) and the conductors of bus 172 are at ground potential. However should contact 110 (for example) momentarily close, the respective input of gate 180 would rise to ground. Should contact 118 (for example) momentarily open, the respective input of gate 182 would rise to about 10 volts. These results can be summarized in the following Table.

TABLE

| Contacts | Relay state | Approximate voltage at gate inputs | |
|---|---|---|---|
| | | Expected | During chatter |
| 110–116 | De-energized | Ground | +10 |
| 118–124 | De-energized | −10 | Ground |
| 110–116 | Energized | −10 | Ground |
| 118–124 | Energized | Ground | +10 |

It should be observed form the Table that, regardless of whether switches 90–94 are "up" or "down" (that is, regardless of whether relay 106 is in the de-energized or energized mode), the voltage at the appropriate input of gate 180 or 182 rises by approximately 10 volts during contact chatter. Gates 180 and 182 are provided as parts of integrated circuits 184 and 186, respectively. These integrated circuits are preferably Number 4002 CMOS IC's available, for example, from National Semiconductor Corporation, 2900 Semiconductor Drive, Santa Clara, Calif. 95051. Each IC provides a pair of four-input NOR gates, one of which is superfluous in the embodiment of FIG. 2. Accordingly, the inputs of gates 188 and 190 are tied to ground, and their outputs are left disconnected. Circuit 184 receives power via power supply port 192 ($V_{CC}$, pin 14 of the 4002 chip) and power supply port 194 ($V_{DD}$, pin 7 of the 4002 chip). Similarly, circuit 186 receives power through power supply ports 196 and 198. The 4002 chip operates with $V_{CC}$ three to 15 volts higher than $V_{DD}$, with the input signals to the gates falling between $V_{CC}$ and $V_{DD}$. The gates interpret an input signal close to $V_{CC}$ as a digital "high" or "one" and a signal close to $V_{DD}$ as a digital "low" or "zero."

With continuing reference to FIG. 2, power supply translation circuits 132 and 138 shift $V_{CC}$ and $V_{DD}$ up or down to accommodate the voltage level of the input signals which are received when relay 106 is energized or de-energized. For example it will be recalled from the foregoing Table that gate 180 receives input signals of ground or approximately +10 volts when relay 106 is de-energized (switches 190–194 "up") and approximately −10 volts or ground when relay 106 is energized (switches 90–94 "down"). Accordingly, circuit 132 grounds port 194 ($V_{DD}$) and supplies approximately 15 volts to port 192 ($V_{CC}$) when relay 106 is de-energized and shifts both voltages downward by 15 volts (that is, grounds port 192 and supplies approximately minus 15 volts to port 194) when relay 106 is energized. This is accomplished as follows:

When switches 90–94 are "up" solenoid 104, in addition to solenoid 102, is de-energized. Accordingly, contacts 128 and 130 are closed while contacts 140 and 142 are open. These contact conditions effectively place current limiting resistor 196 and 15 volt Zener diode 198 between the positive terminal of DC supply 86 and conductor 200, and effectively connect conductor 202 to ground. Zener diode 198 acts as voltage regulator to reduce the voltage to a level (approximately 15 volts in the preferred embodiment) suitable for integrated circuit 184. When switches 90–94 are "down", so that solenoids 102 and 104 are energized, normally open contacts 140 and 142 are closed and normally contacts 128 and 130 are opened. These contact conditions connect conductor 200 to ground and connect conductor 202 to the negative terminal of DC supply 88 via current limiting resistor 204 and 15 volt Zener diode 206. Thus while relay 106 is in the de-energized state and the inputs to gate 180 are either ground level or approximately +10 volts, power supply port 194 of circuit 184 is connected to ground and power supply 192 receives +15 volts; when relay 106 is energized and the inputs to gate 180 are either ground level or approximately −10 volts, port 192 is connected to ground and port 194 is 15 volts below ground. Translating the voltage level of the power supplied to circuit 184 in this way permits gate 180 to respond to input signals having more than two levels.

With continuing reference to FIG. 2, the operation of circuit 138 is similar to that of circuit 132. With switches 90–94 in the "up" position, normally closed contacts 134 and 136 are indeed closed, so that conductor 208 is connected to ground and conductor 210 is connected to the negative terminal of DC supply 88 via current limiting resistor 212 and 15 volt Zener diode 214. On the other hand when switches 90–94 are 37 down" conductor 210 is connected to ground and conductor 208 is connected to the positive terminal of DC supply 86 via current limiting resistor 216 and 15 volts Zener diode 218. It will be seen from the foregoing Table that the supply voltages are appropriate for the expected input states of gate 190.

With continuing reference to FIG. 2, when relay 106 is tested in the de-energized mode, switches 90–94 are placed in the "up" position and vibration mechanism 18 is activated for a predetermined period, such as 20 seconds, and at a predetermined intensity, such as 44 spectrum gravities. If during this period all of contacts 110–116 remain closed, all inputs to gate 180 remain at ground level (digitally "low") and the gate output is approximately 15 volts (digitally "high"). Should one or more of contacts 110–116 open briefly during the test, the output of gate 180 will go "low" for the chatter duration. During the de-energized test all inputs to gate 182 remain at approximately −10 volts (digitally "low") if contacts 118–124 remain open, so that the output of gate 182 is ground level (digitally "high").

Should one or more of contacts 118-124 close momentarily during the test, however, the output of gate 182 would fall to −15 volts (digitally "low") during the period of chatter.

When relay 106 is tested in the energized mode, switches 90-94 are placed in the "down" position and vibration mechanism 108 is activated for the predetermined period at the predetermined intensity. If one of contacts 110-116 momentarily closes, the corresponding input to gate 180 rises from approximately −10 volts (digitally "low") to ground and the gate output becomes −15 volts (digitally "low"). Similarly, should one or more of contacts 118-124 momentarily open while relay 106 is tested in the energized mode, the output of gate 182 would fall from 15 volts (digitally "high" to ground (digitally "low") as long as at least one of contacts 118-124 remain open.

In summary, in both the energized and de-energized testing modes, the outputs of both gates 180 and 190 remain "high" except during periods of chatter. The gate outputs are supplied to inverters 220 and 222 which, although not illustrated, are powered by circuits 132 and 138, respectively, in order to accommodate the digital signals encountered. The output of inverter 220 is digitally "high" during chatter by at least one of contacts 110-116 and the output of inverter 222 is digitally "high" during chatter by at least one of contacts 118-124. The signals could be monitored by chart recorders, for example, but it is desirable to provide a more accurate and less cumbersome way to determine the duration of contact chatter. Accordingly, detector 82 includes interruption alarms 224 and 226. Interruption alarm 224 has chatter input terminal 228 connected to the output of inverter 220, and power supply ports 230 and 232 for receiving operating power via conductors 202 and 200 respectively from power supply translation circuit 132. Similarly, interruption alarm 226 has a chatter input terminal 234 connected to the output of inverter 222 and power supply ports 236 and 238 for receiving power from circuit 138. The circuitry for alarms 224 and 226 is identical.

Turning next to FIG. 3, alarm 224 includes a timer circuit 240. Circuit 240 is provided by a Number 555 integrated circuit available, for example, from National Semiconductor Company, 2900 Seiconductor Drive, Santa Clara, Calif. 95051. The pins of the 555 IC are wired as indicated in the drawing, with the timer period being determined by resistor 242, potentiometer 244, and capacitor 246. Potentiometer 244 is adjusted so that a pulse of 2 milliseconds or longer applied to chatter input terminal 228 results in an inverted pulse at output pin 3. The output pulse is received by an inverter formed by resistor 248, transistor 250, and resistor 252 and is then supplied to pin 3 of latch circuit 254. Latch circuit 254 is a Number 74C74 integrated circuit available, for example, from National Semiconductor Company, 2900 Semiconductor Drive, Santa Clara, Calif. 95051. With latch circuit 254 having been set by a pulse at pin 3, the latch output at pin 6 becomes digitally "low." A driver circuit formed by resistor 256, transistor 258, and resistor 260 then turns LED 262 ON to provide a visual indication that a chatter pulse exceeding 2 milliseconds in duration has been received at chatter input terminal 228. Pin 1 of latch circuit 254 is normally held "high" by resistor 264 but it driven "low" when momentary contact switch 266 is depressed. Depression of switch 266 resets latch circuit 254 and turns LED 266 OFF.

Assuming that potentiometer 244 has been set to trigger timer circuit 240 when pulse duration is 2 milliseconds or greater, the output at pin 3 of circuit 240 remains "high" if a pulse of 1.9 milliseconds (for example) is received at terminal 228. A problem would arise, however, if a rapid sequence of such pulses were applied to terminal 228, since the charge produced on capacitor 246 by one pulse would not decay to zero before the next pulse arrived. This "pulse piling" phenomenon might raise the voltage at pin 2 of timer circuit 240 sufficiently to trigger the circuit, and thus produce a false indication by LED 262, even though none of the input pulses applied to terminal 228 had a duration of 2 milliseconds. A discharge circuit consisting of resistor 268, transistor 270, resistor 272, and transistor 274 receives the pulse from terminal 228 and discharges capacitor 246 at the trailing edge of the pulse. Accordingly, the discharge circuit avoids the additive effect of pulse piling on capacitor 246, so that LED 262 turn ON only if the input pulses at terminal 228 exceed 2 milliseconds.

With reference next to both FIGS. 2 and 3, it will be apparent that the LED's 262 of each of interruption alarms 224 and 226 may be illuminated when switches 90-94 are actuated to change the energized/denergized state of relay 106. Accordingly, switches 226 may be depressed to reset latch circuits 254 prior to each test. However, it is necessary to automatically reset the latch circuit 254 of interruption alarm 226 when the transistor mode of relay 106 is tested. IEEE 501-1978 provides that the transition mode is to be tested during a transition from the de-energized to the energized state, and during this test it is necessary to keep the LED 262 of alarm 226 OFF until all of contacts 118-124 have closed. Accordingly, after the initial closure of contacts 118-124, reset input terminals 276 of alarms 224 and 226 receive reset pulses from transition circuit 278, as will be described below, in order to automatically reset latch circuits 254. This automatic resetting ensures that alarms 224 and 226 are sensitive to contact bouncing at the time when such sensitivity is needed during the transition test.

In FIG. 2, transition circuit 278 has power supply ports 280 and 282 for receiving power from circuit 132 via conductors 200 and 202, respectively. Additionally, power supply ports 284 and 286 receive power from circuit 138 via conductors 210 and 208, respectively. Input terminal 288 is connected to the output of gate 182, and input terminal 290 is connected to movable contact 98 of switch 92 by conductor 292. Finally, output port 294 is connected to reset input terminal 276 of interruption alarm 224, and output port 296 is connected to the reset input terminal 276 of alarm 226.

Figure 5B:
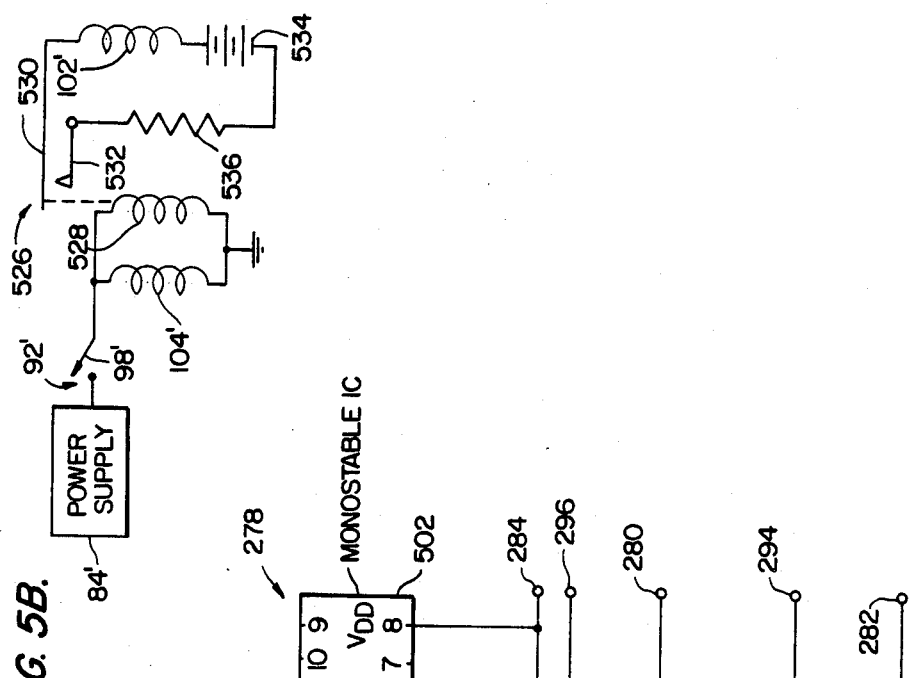
FIG. 5B is an abbreviated schematic diagram illustrating how an auxiliary relay can be added to the circuit of FIG. 2 in order to delay transitions by the relay under test.
Figure 5A:
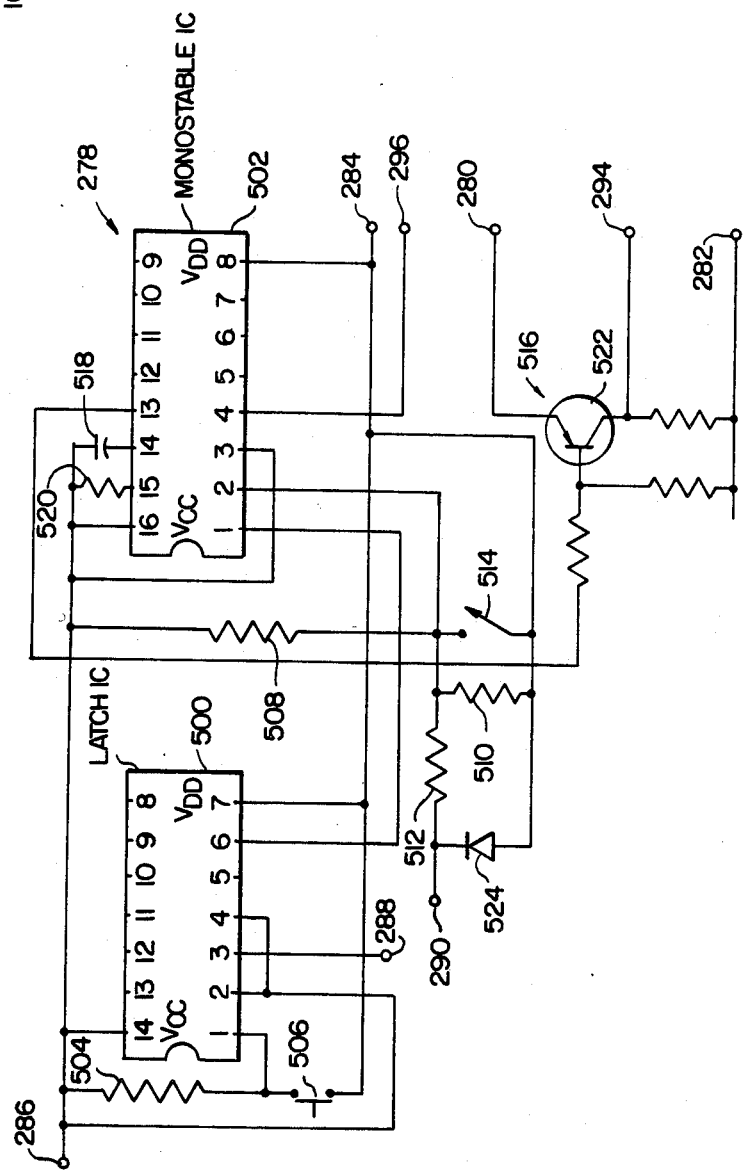
FIG. 5A is a schematic diagram of a transition circuit in FIGS. 2 and 4.

Turning next to FIG. 5a, the circuitry of transition circuit 278 will now be described. Circuit 278 includes a latch circuit 500 and a monostable device 502. Circuit 500 is provided by a Number 74C74 integrated circuit, and monostable device 502 is provided by a Number 74C121 integrated circuit, which is a two-input logic gate type device. Both integrated circuits are available, for example, from National Semiconductor Corporation, 2900 Semiconductor Drive, Santa Clara, Calif. 95051. Circuits 500 and 502 receive power from power supply translation circuit 138 via power supply port 286, which is connected to pin 14 of circuit 500 and pin 16 of circuit 502, and power supply port 284, which is connected to pin 7 of circuit 500 and pin 8 of circuit 502. Pin 1 (reset) of latch circuit 500 is connected to power supply port 286 by resistor 504 and to power supply port 284 by manual reset switch 506. Pin 3 (input) of latch circuit 500 is connected by input terminal 288 to the output of gate 182 (FIG. 2). Pin 6 (output) of latch circuit 500 is connected to pin 1 of monostable device 502. Pin 2 (input) of monostable device 502 is connected by resistor 508 to power supply port 286, by resistor 510 to power supply port 284, by resistor 512 to input terminal 290, and by test mode switch 514 to power supply port 284. Pin 4 (output) of monostable device 502 is connected via output port 296 to pin 1 (reset) of the latch circuit 254 (see FIG. 3) of interruptional alarm 226 (see FIG. 2). Pin 13 (complemented output) of monostable device 502 is connected to the input of level translation circuit 516. Finally, pins 14 and 15 of monostable device 502 are connected to power supply port 286 by capacitor 518 and resistor 520, respectively. Other connections to circuits 500 and 502 are as illustrated in the drawing.

With continuing reference to FIG. 5a, level translation circuit 516 includes a transistor 522 whose emitter is connected to power supply port 280 and whose collector is connected via output port 294 to pin 1 (reset) of the latch circuit 254 of interruption alarm 224. The collector of transistor 522 is also connected to a resistor (not numbered) to power supply port 282. The base of transistor 522 is connected by a resistor (not numbered) to pin 13 (complimented output) of monostable device 502.

With continuing reference to FIG. 5A, diode 524 is connected to solenoids 102 and 104 (FIG. 2) via input terminal 290 and serves as a protective device to avoid inductive spikes.

With reference to FIGS. 2 and 5A, the operation of transition circuit 278 will now be described.

With relay 106 is tested in the de-energized mode (switches 90–94 in the "up" position), power supply ports 282 and 286 are maintained at ground potential, power supply port 284 is maintained at −15 volts, and power supply port 280 is maintained at +15 volts. During the de-energized test, test mode switch 514 is closed, thereby holding the input signal applied to pin 2 of monostable device 502 at −15 volts, or digitally "low." The output provided by device 502 to output port 296 is digitally "high" (ground potential), which allows normal operation of the latch circuit 254 (FIG. 3) in interruption alarm 226. Also, the output at pin 13 of monostable device 502 is digitally "low" (−15 volts), the "low" signal being inverted by transistor 522 so that a digitally "high" (+15 volts) signal is applied via output port 294 to pin 1 of the latch circuit 254 (FIG. 3) in interruption alarm 224. Accordingly, interruption alarm 224 operates normally.

Test mode switch 514 remains closed when relay 106 is tested in the energized mode (switches 90–94 in the "down" position). During the energized mode, power supply ports 280 and 284 are at ground potential, port 282 is at −15 volts, and port 286 is at +15 volts. With switch 514 closed, the output at port 296 remains "high" (+15 volts), again allowing the latch circuit 254 (FIG. 3) in interruption alarm 226 to operate in the normal manner. Similarly, the output at pin 13 of monostable device 502 is digitally "low" (ground potential), which causes a digitally "high" (ground potential) output at port 294. The "high" output at port 294 permits the latch circuit 254 (FIG. 3) in interruption alarm circuit 224 to operate in its normal mode.

Unlike tests in the energized and de-energized modes, test mode switch 514 is open during the transition mode test. Switches 90–94 are originally in the "up" position. Resistor 510 has a resistance that is much smaller than that of resistor 508 (for example, 10 kilohms versus 100 kilohms), so that the input signal applied to pin 2 of monostable device 502 remains digitally "low" despite the fact that switch 514 is open. The transition mode test is conducted by closing switches 90–94, whereupon power supply ports 280 and 284 are grounded, the potential at power supply port 282 becomes −15 volts, and the potential at power supply port 286 becomes +15 volts. Following the closure of switches 90–94, +125 volts (the voltage of DC source 86) is applied to input terminal 290. This value is attenuated to a nominal +10 volts (digitally "high") by resistors 512 and 510, so that input pin 2 of monostable device 502 becomes digitally "high" the moment switches 90–94 are transitioned. Input terminal 288 is at ground potential for a brief moment following the switch transition, because normally open contacts 118–124 remain open for an instant, which causes the output of gate 182 to be digitally "low" (ground potential). However at the instant that all of contacts 118–124 close, even if only momentarily, the input signal applied to pin 3 of latch circuit 500 becomes digitally "high," which in turn causes the output at pin 6 of circuit 500 to become digitally "low." The low signal is applied to pin 1 of monostable device 502, which thereupon provides outputs at pins 4 and 13 thereof. The output at pin 4 of circuit 502, which is provided to interruption alarm 226 via output port 296, is a pulse going from +15 volts to 0 volts and then back to +15 volts. The pulse duration is set by the time constant of capacitor 518 and resistor 520, and is typically selected to be 1 millisecond. This pulse serves to reset the latch circuit 254 (FIG. 3) of interruption alarm 226; after the pulse the potential at output port 296 becomes "high" again, permitting the latch circuit 254 of alarm 226 to operate in the normal manner and detect any contact bounce having a duration greater than the predetermined minimum.

The output signal provided by pin 13 of monostable device 502 is a pulse which rises from 0 volts to +15 volts and then returns to 0 volts. Level translation circuit 516 receives this pulse and produces, at output port 294, a pulse which goes from ground potential to −15 volts and then back to ground potential. This signal is applied to interruption alarm 224 to reset the latch circuit 254 (FIG. 3) thereof. When the potential at port 294 goes "high" (ground potential), latch circuit 254 of alarm 224 resumes operation in its normal manner in order to detect contact bounce greater than the predetermined minimum. After the latch circuits 254 of alarms 224 and 226 are reset in the manner described, any further bounces by contacts 118–124 are locked out by latch circuit 500 and will not produce reset outputs at ports 294 and 296 until manual reset switch 506 is closed.

To summarize, transition circuit 278 has an input terminal 290 which is connected to switch 92 and another input terminal 288 which is connected to the gate (here 182) which monitors the normally open contacts (here contacts 118–124). When the potentials at both terminals 288 and 290 become digitally "high", monostable device 502 provides an output to reset the latch 254 of the interruption alarm (here 226) corresponding to the normally open contacts. Monostable device 502 also provides an inverted output which is translated downward 15 volts by level translation circuit 516 in order to reset the latch circuit 254 of interruption alarm 224. The reset pulse duration, typically a millisecond, is set by capacitor 518 and resistor 520.

During the transition mode test, power supply translation circuits 132 and 138 must supply the appropriate voltages to power supply ports 280-286 of transition circuit 278 before closure of normally open contacts 118-124. Accordingly, it is desirable to select a high quality relay for circuits 132 and 138, so that contacts 128, 130, 134, 136, and 140-146 will operate quickly. In the event that the relay 106 under test is also quickly repsonsive, however, it may be desirable to operate relay 106 through an auxiliary relay in order to ensure that the contacts in relay 106 operate after those in power supply translation circuits 132 and 138. An abbreviated diagram illustrating operation with an auxiliary relay is illustrated in FIG. 5B.

In FIG. 5B, power supply 84' corresponds to power supply 84 in FIG. 2; switch 92' corresponds to switch 92 in FIG. 2, contact 98' corresponds to contact 98 in FIG. 2, solenoid 104' corresponds to solenoid 104 in FIG. 2; and solenoid 102' corresponds to solenoid 102 of relay under test 106 in FIG. 2. The auxiliary relay 526 includes a solenoid 528 connected parallel to solenoid 104', and a movable contact 530 which cooperates with fixed contact 532. Relay 526 is actuated when switch 92' is closed, whereupon solenoid 102' is connected in series with DC supply 534 and current limiting resistor 536. Accordingly, it will be apparent that operation of contacts 110-124 of relay 106 is delayed by a brief period imposed by auxiliary relay 526.

Figure 4:
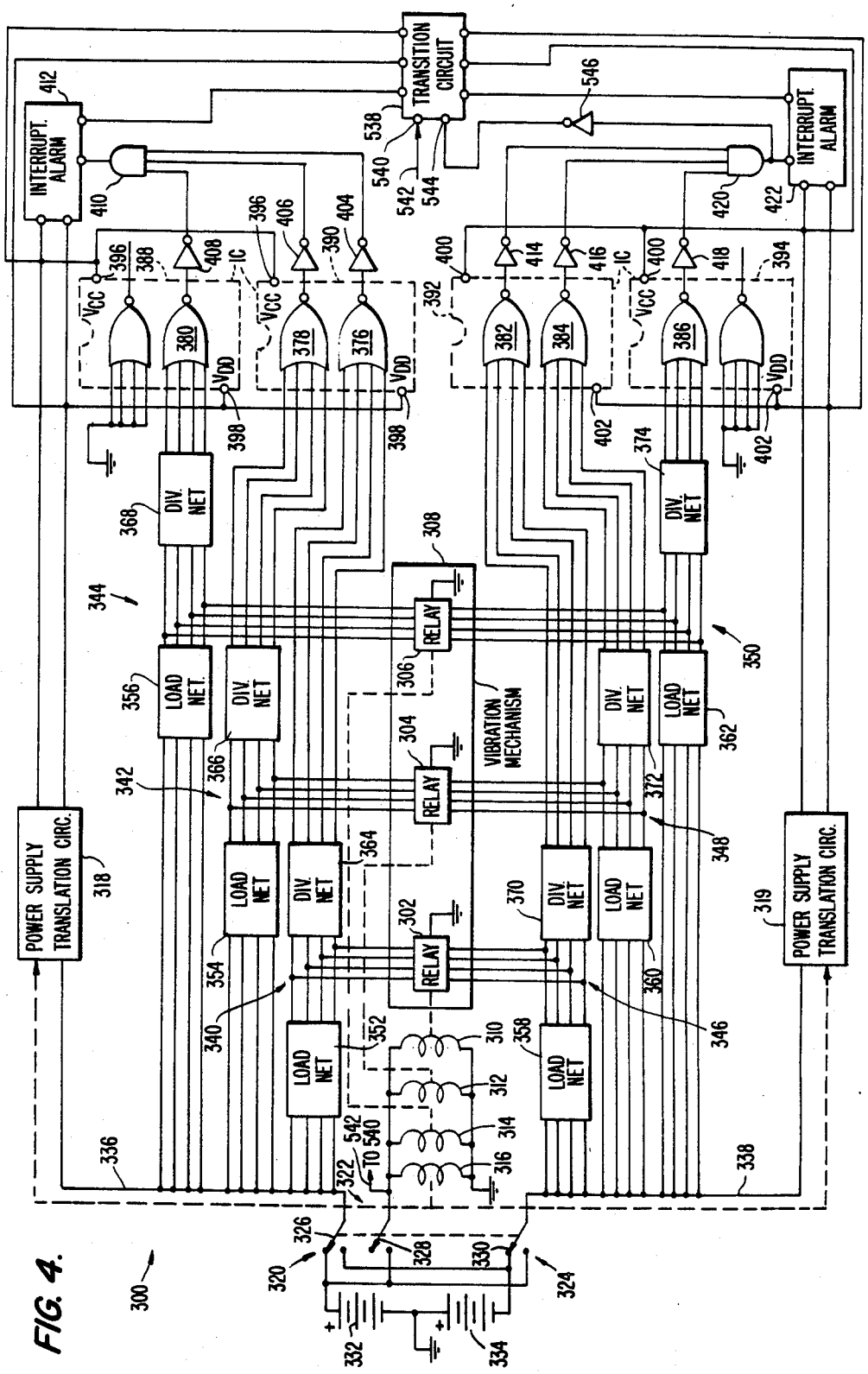
FIG. 4 is a schematic diagram of an embodiment of the contact chatter detector of the invention suitable for use in testing a plurality of relays simultaneously.

The circuitry of FIG. 2 can readily be expanded so that more than one relay can be tested at the same time. FIG. 4, for example, illustrates a contact chatter detector 300 which tests three 4PDT relays 302, 304, and 306 simultaneously. Relays 302-306 are mounted on vibration mechanism 308. Relay 302 includes a solenoid 310, relay 304 includes a solenoid 312, and relay 306 includes a solenoid 314. Solenoid 316 is part of a relay having contacts (not illustrated) in power supply translation circuits 318 and 319. Switches 320, 322, and 324 are provided with movable contacts 326, 328, and 330. Switches 320-324 are connected to a bipolar power supply having first and second series-connected voltage sources in the form of DC supplies 332 and 334. As will be seen in FIG. 4 switches 320-324 and DC supplies 332 and 334 are connected so that, in the "up" position of the switches, conductor 336 is connected to the positive terminal of DC supply 332, solenoids 310-316 are disconnected from the power supply, and conductor 338 is connected to the negative terminal of DC supply 334. In the "down" position of switches 320-324, conductor 336 is connected to the negative terminal of DC supply 334, conductor 338 is connected to the positive terminal of DC supply 332, and solenoids 310-316 are energized.

With continuing reference to FIG. 4, the normally closed contacts (not illustrated) of relay 302 are connected to bus 340; the normally closed contacts (not illustrated) of relay 304 are connected to bus 342; the normally closed contacts (not illustrated) of relay 306 are connected to bus 344; the normally open contacts (not illustrated) of relay 302 are connected to bus 346; the normally open contacts (not illustrated) of relay 304 are connected to bus 348; and, finally, the normally open contacts (not illustrated) of relay 306 are connected to bus 350. Buses 340-344 are connected to conductor 336 via load networks 352, 354, and 356, respectively. Similarly, buses 346-350 are connected to conductor 338 via load networks 358, 360, and 362, respectively. Divider networks 364, 366, 368, 370, 372, and 374 connect buses 340-350 to the inputs of gates 376, 378, 380, 382, 384, and 386, respectively. These gates are present in integrated circuits 388, 390, 392, and 394, such as the previously-mentioned Number 4002 chips. Each of circuits 388 and 390 has a power supply port 396 connected to the relatively positive output of translation circuit 318 and a power supply port 398 connected to the relatively negative output of circuit 318. Similarly, each of circuits 392 and 394 has a power supply port 400 connected to the relatively positive output of circuit 319 and a power supply port 402 connected to the relatively negative output of circuit 319.

The outputs of gates 376-380 are provided to inverters 404-408. In order to avoid an interrupt alarm for each of inverters 404-408, gate 410 ANDs the outputs and supplies an input signal to interruptional alarm 412. It will be apparent that gate 410 emits a pulse to alarm 412 during chatter by any of the contacts (not illustrated) connected to buses 340-344. In a similar manner inverters 414-418 supply inputs to AND gate 420 in order to provide a combined chatter signal for interruption alarm 422. Transition circuit 538, which receives power from circuits 318 and 319, is provided to reset interruption alarms 412 and 422 in the manner previously discussed. Input terminal 540 of circuit 538 is connected by conductor 542 to movable contact 328 of switch 322, while input terminal 544 is connected to the output of gate 420 through inverter 546.

From the foregoing discussion it will be seen that the present invention provides a contact chatter detector which continuously monitors the contacts of one or more relays under test and which signals if chatter duration exceeds a predetermined minimum. Due to the use of a bipolar power supply and power supply translation circuitry, all relay states can be tested without wiring changes between tests. Moreover, "pulse piling" is avoided, so that rapid chatter does not lead to an erroneous result.

It will be understood that the above description of the present invention is susceptible to various modifications, changes and adaptations, and the same are intended to be comprehended within the meaning and range of equivalents of the appended claims.

What I claim is:

1. A testing device for detecting contact chatter during vibration of electrical components having at least one group of contacts, each group including a first fixed contact, a second fixed contact spaced apart from the first fixed contact, and a movable group disposed between the first and second contacts, comprising:
   bipolar power supply means having first and second terminals for supplying power at a potential that is positive with respect to ground at said first terminal and for supplying power at a potential that is negative with respect to ground at said second terminal;
   switch means having first and second switch ports for connecting said first terminal to said first switch port and said second terminal to said second switch port or said first terminal to said second switch port and said second terminal to said first switch port;
   means for maintaining said movable contact of each said at least one group at substantially ground potential;

means for electrically connecting said first switch port and said first contact of each said at least one group;

means for electrically connecting said second switch port and said second contact of each said at least one group;

first translation means, having a first pair of power output ports, for grounding one of said first pair of power output ports and maintaining the other at a predetermined voltage having the same polarity as the voltage at said first switch port, the grounded one of said first pair of power output ports changing when the polarity of the voltage at said first switch port changes;

second translation means, having a second pair of power output ports, for grounding one of said second pair of power output ports and maintaining the other at a predetermined voltage having the same polarity as the voltage at said second switch port, the grounded one of said second pair of power output ports changing when the polarity of the voltage at said second switch port changes;

first indicator means, connected to said first contact of each said at least one group and to said first pair of power output ports, for detecting contact chatter; and second indicator means, connected to said second contact of each said at least one group and said second pair of power output ports, for detecting contact chatter.

2. The testing device of claim 1, wherein said means for electrically connecting said first switch port and said first contact of each said at least one group comprises at least one first resistor, each said at least one first resistor corresponding to a respective first contact and being connected between said first switch port and the respective first contact.

3. The testing device of claim 2, wherein said first indicator means comprises at least one series combination of second and third resistors that are connected at an intermediate connection point, each said at least one series combination corresponding to a respective first contact and being connected between the respective first contact and ground.

4. The testing device of claim 3, wherein said means for electrically connecting said second switch port and said second contact of each said at least one group comprises at least one fourth resistor, each said at least one fourth resistor corresponding to a respective second contact and being connected between said second switch port and the respective second contact.

5. The testing device of claim 4, wherein said second indicator means comprises at least one series combination of fifth and sixth resistors that are connected at an intermediate connection point, each said at least one series combination corresponding to a respective second contact and being connected between the respective second contact and ground.

6. The testing device of claim 5, wherein said components have a plurality of groups of contacts and wherein said first indicator means further comprises first gate means, receiving power from said first pair of power output ports, for logically combining signals at the intermediate connection points of said second and third resistors.

7. The testing device of claim 6, wherein said second indicator means further comprises second gate means, receiving power from said second pair of power output ports, for logically combining signals at the intermediate connection points of said fifth and sixth resistors.

8. The testing device of claim 7, wherein said testing device tests said components one at a time, and wherein said first gate means comprises a gate having inputs connected to the intermediate connection points of said second and third resistors, and wherein said first indicator means further comprises means connected to the output of said gate for detecting contact chatter having a predetermined duration.

9. The testing device of claim 8, wherein said second gate means comprises a further gate having inputs connected to the intermediate connection points of said fifth and sixth resistors, and wherein said second indicator means further comprises means connected to the output of said further gate for detecting contact chatter having a predetermined duration.

10. The testing device of claim 9, wherein said means connected to the output of said gate and said means connected to the output of said further gate each comprise a timer circuit having an input and an output, an RC circuit connected to said input of said timer circuit, means for discharging said RC circuit, and a latch responsive to said output of said timer circuit.

11. The testing device of claim 10, wherein said components are relays having solenoids, and wherein said switch means further comprises means for selectively energizing the solenoids.

12. The testing device of claim 11, further comprising transition circuit means, responsive to the output of one of said gate and further gate, for automatically resetting at least one of said latches when relay transitions are tested.

13. The testing device of claim 7, wherein said testing device tests a plurality of components at a time, wherein said first gate means comprises a plurality of gates, each gate corresponding to a respective one of said plurality of components and having inputs connected to the intermediate connection points of the series combinations of second and third resistors that are connected to the first contacts of said respective one of said plurality of components, and wherein said first indicator means further comprises means connected to the outputs of said gates for detecting chatter having a predetermined duration.

14. The testing device of claim 13, wherein said second gate means comprises a plurality of further gates, each further gate corresponding to a respective one of said plurality of components and having inputs connected to the intermediate connection points of the series combinations of fifth and sixth resistors that are connected to the second contacts of said respective one of said plurality of components, and wherein said second indicator means further comprises means connected to the outputs of said further gates for detecting chatter having a predetermined duration.

15. The testing device of claim 14, wherein said means connected to the outputs of said gates and said means connected to the outputs of said further gates each comprise a timer circuit having an input and an output, an RC circuit connected to said input of said timer circuit, means for discharging said RC circuit, and a latch responsive to said output of said timer circuit.

16. The testing device of claim 15, wherein said components are relays having solenoids, and wherein said switch means further comprises means for selectively energizing the solenoids.

17. The testing device of claim 16, further comprising transition circuit means, responsive to the outputs of one of said first gate means and said second gate means, for automatically resetting at least one of said latches when relay transitions are tested.

18. The testing device of claim 1, wherein both of said indicator means comprise means for measuring chatter duration.

19. The testing device of claim 1, further comprising a relay having a solenoid, a plurality of normally open contacts, and a plurality of normally closed contacts, wherein said switch means further comprises means for selectively energizing said solenoid of said relay, and wherein said first translation means comprises a series combination of a normally closed contact of said relay and a voltage regulator connected between said first switch port and one of said first pair of power output ports, a normally open contact of said relay connected between said one of said first pair of power output ports and ground, a series combination of a normally open contact of said relay and a voltage regulator connected between said first switch port and the other of said first pair of power output ports, and a normally closed contact of said relay connected between said other of said first pair of power output ports and ground.

20. The testing device of claim 1, wherein the absolute value of the potential at each of said first and second terminals of said bipolar power supply means is at least 100 volts.

* * * * *